(12) United States Patent
Lewis

(10) Patent No.: US 7,796,417 B1
(45) Date of Patent: Sep. 14, 2010

(54) MEMORY CIRCUITS HAVING PROGRAMMABLE NON-VOLATILE RESISTORS

(75) Inventor: David Lewis, Toronto (CA)

(73) Assignee: Altera Corporation, San Jose, CA (US)

( * ) Notice: Subject to any disclaimer, the term of this patent is extended or adjusted under 35 U.S.C. 154(b) by 190 days.

(21) Appl. No.: 12/102,736

(22) Filed: Apr. 14, 2008

(51) Int. Cl.
*G11C 11/00* (2006.01)

(52) U.S. Cl. ............... 365/148; 365/185.05; 365/189.09

(58) Field of Classification Search ................. 365/148, 365/158, 100, 113, 163
See application file for complete search history.

(56) References Cited

U.S. PATENT DOCUMENTS

| | | | |
|---|---|---|---|
| 6,172,899 B1 * | 1/2001 | Marr et al. | 365/154 |
| 6,175,525 B1 * | 1/2001 | Fulkerson et al. | 365/189.05 |
| 6,317,359 B1 * | 11/2001 | Black et al. | 365/158 |
| 6,944,050 B2 * | 9/2005 | Kang et al. | 365/158 |
| 7,208,372 B2 | 4/2007 | Hsu et al. | |
| 7,495,945 B2 * | 2/2009 | Roehr | 365/148 |
| 2004/0113192 A1 * | 6/2004 | Wicker | 257/298 |
| 2004/0125643 A1 * | 7/2004 | Kang et al. | 365/148 |
| 2006/0181916 A1 * | 8/2006 | Roehr | 365/148 |

OTHER PUBLICATIONS

Toshitsugu Sakamoto et al., "A $Ta_2O_5$ solid-electrolyte switch with improved reliability," 2007 Symposium on VLSI Technology Digest of Technical Papers, pp. 38-39.

S.J. Ahn et al., "Highly Manufacturable High Density Phase Change Memory of 64Mb and Beyond," 2004, pp. 1-4.

Shunichi Kaeriyama et al., "A Nonvolatile Programmable Solid-Electrolyte Nanometer Switch," IEEE Journal of Solid-State Circuits, vol. 40, No. 1, Jan. 2005, pp. 168-176.

* cited by examiner

*Primary Examiner*—Gene N. Auduong
(74) *Attorney, Agent, or Firm*—Steven J. Cahill

(57) ABSTRACT

A non-volatile memory circuit includes a first inverter, a second inverter coupled to the first inverter, a first programmable non-volatile resistor coupled to the first inverter, and a first access device coupled to the first programmable non-volatile resistor. According to some embodiments, a second programmable non-volatile resistor is coupled to the second inverter, and a second access device is coupled to the second programmable non-volatile resistor. The access devices can be, for example, transistors or diodes.

20 Claims, 7 Drawing Sheets

MEMORY CIRCUITS HAVING PROGRAMMABLE NON-VOLATILE RESISTORS

BACKGROUND OF THE INVENTION

The present invention relates to electronic circuits, and more particularly, to memory circuits having programmable non-volatile resistors.

A memory circuit stores digital information. Dynamic random access memory (DRAM), static random access memory (SRAM), and Flash memory are examples of memory circuits.

BRIEF SUMMARY OF THE INVENTION

According to some embodiments of the present invention, a non-volatile memory circuit includes a first inverter, a second inverter coupled to the first inverter, a first programmable non-volatile resistor coupled to the first inverter, and a first access device coupled to the first programmable non-volatile resistor.

According to other embodiments, a second programmable non-volatile resistor is coupled to the second inverter, and a second access device is coupled to the second programmable non-volatile resistor. The access devices can be, for example, transistors or diodes. The present invention includes methods and systems for performing the embodiments described herein.

Various objects, features, and advantages of the present invention will become apparent upon consideration of the following detailed description and the accompanying drawings, in which like reference designations represent like features throughout the figures.

DETAILED DESCRIPTION OF THE INVENTION

Figure 1:
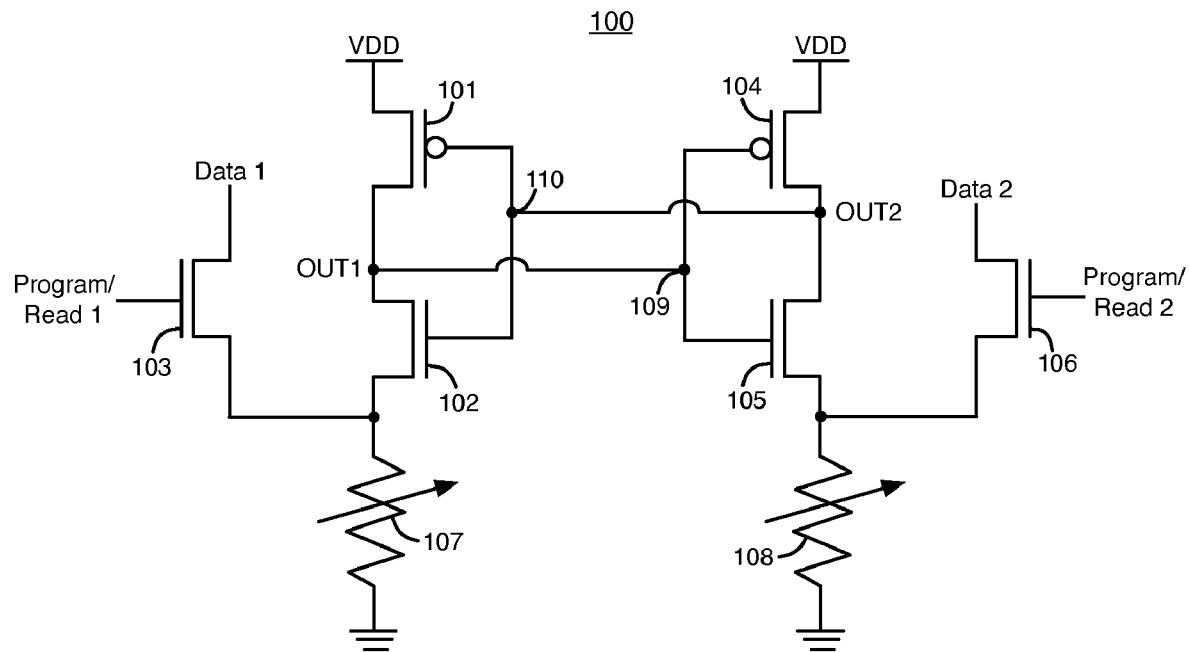
FIG. 1 is a diagram of a non-volatile memory cell having access transistors for programming programmable non-volatile resistors, according to an embodiment of the present invention.

FIG. 1 is a diagram of a non-volatile memory cell, according to an embodiment of the present invention. Non-volatile memory cell 100 shown in FIG. 1 includes six metal oxide semiconductor field-effect transistors (MOSFETs) 101-106 and two non-volatile programmable resistors 107-108. Transistors 101 and 104 are p-channel MOSFETs, and transistors 102-103 and 105-106 are n-channel MOSFETs. Memory cell 100 and other memory cells described herein can be fabricated in an integrated circuit, such as an FPGA or an application specific integrated circuit (ASIC).

P-channel transistor 101 and n-channel transistor 102 are coupled together in series at their drains to form a first inverter circuit. P-channel transistor 104 and re-channel transistor 105 are coupled together in series at their drains to form a second inverter circuit. The first inverter formed by transistors 101/102 is cross-coupled with the second inverter formed by transistors 104/105. Thus, the output terminal OUT1 of the first inverter at the drains of transistors 101/102 is coupled to the input terminal of the second inverter at the gates of transistors 104/105 (node 109). The output terminal OUT2 of the second inverter at the drains of transistors 104/105 is coupled to the input terminal of the first inverter at the gates of transistors 101/102 (node 110).

The sources of p-channel transistors 101 and 104 receive a power supply voltage VDD. The source of n-channel transistor 102 is coupled to a first terminal of programmable non-volatile resistor 107. The second terminal of programmable non-volatile resistor 107 is at the ground voltage. The source of n-channel transistor 105 is coupled to a first terminal of programmable non-volatile resistor 108. The second terminal of programmable non-volatile resistor 108 is at the ground voltage.

The source of transistor 103 is coupled to the source of transistor 102 and the first terminal of programmable non-volatile resistor 107. The drain of transistor 103 is coupled to a first data signal line (Data 1). The gate of transistor 103 is coupled to a first program/read signal line (Program/Read 1).

The source of transistor 106 is coupled to the source of transistor 105 and the first terminal of programmable non-volatile resistor 108. The drain of transistor 106 is coupled to a second data signal line (Data 2). The gate of transistor 106 is coupled to a second program/read signal line (Program/Read 2).

Transistors 103 and 106 are access transistors. Data is written into memory cell 100 through transistors 103 and 106. Transistors 103 and 106 are coupled to the programmable non-volatile resistors 107 and 108, respectively, so that resistors 107 and 108 can be accessed as a bulk memory array for programming or read back.

Resistors 107 and 108 can be, for example, electrolytic programmable non-volatile resistors. An electrolytic programmable non-volatile resistor has an electrolyte material between two electrodes. As another example, resistors 107 and 108 can be made of chalcogenide glass. Chalcogenide glass is the material used in phase-change memory cells. The crystalline and amorphous states of chalcogenide glass have different electrical resistivity. The amorphous, high resistance state represents one logic state, and the crystalline, low resistance state represents another logic state. These examples are provided for the purpose of illustration and are not intended to limit the scope of the present invention. Alternatively, resistors 107 and 108 can be formed in other configurations using other materials that provide programmable and non-volatile resistive characteristics.

An FPGA typically requires memory cells that have low leakage current and a full supply voltage range that is accessible from every bit stored in the memory cells. However, electrolytic and chalcogenide glass programmable resistors typically have a low dynamic voltage range between their programmed high and low resistance states. A very high resistance of over $1 \times 10^9$ ohms would be required to achieve a low leakage state. Inverters 101/102 and 104/105 are added to memory cell 100 to provide a full supply voltage range between VDD and ground for the data stored in memory cell 100. Memory cell 100 is a low complexity memory cell that consumes a small amount of area on an integrated circuit die. As a result, memory cell 100 is particularly useful for forming a memory array in an FPGA.

A process for programming resistors 107 and 108 is now described. Initially, the first and second program/read signal lines (Program/Read 1 and 2) are charged to voltages that turn on access transistors 103 and 106. Also, the first and second data signal lines (Data 1 and 2) are charged to voltages that program resistors 107 and 108 to low and high resistance values. A memory array can contain numerous memory cells 100 (e.g., thousands of memory cells). In each memory cell 100, the voltages on the first and second data signal lines program one resistor 107/108 to a low resistance and the other resistor 107/108 to a high resistance. A high resistance corresponds to a logic high state (i.e., a logic 1), and a low resistance corresponds to a logic low state (i.e., a logic 0). Thus, logic values are written into memory cell 100 by programming the resistances of programmable non-volatile resistors 107 and 108.

Voltage waveforms of different amplitudes and shapes can be used to set each of the resistors 107 and 108 into different states. For example, with a phase change resistor, a current pulse that abruptly ends may cause a resistor to crystallize into one state, while a gradual reduction in the current pulse may cause the resistor to anneal into another state. For other forms of programmable non-volatile resistors such as electrolytic resistors, the direction of the current may affect its resistance, with a current in one direction creating the high resistance state and a current in the opposite direction creating a low resistance state.

When the voltage on the first program/read signal line is set to turn on transistor 103, an appropriate voltage and current waveform can be driven through the first data signal line to set resistor 107 to the desired resistance state. The actual voltage and current waveform depends on the type of programmable non-volatile resistor used. For any particular form of programmable non-volatile resistor, an associated voltage and current waveform is used to set the resistor to the high or low resistance state.

Subsequently, the voltages on the program/read signal lines and the data signal lines are held low during the normal operation of memory cell 100 to keep access transistors 103 and 106 off. When memory cell 100 is powered down, supply voltage VDD decreases to zero. Non-volatile resistors 107 and 108 maintain their programmed resistance values even when memory cell 100 is not receiving charge from supply voltage VDD. Because resistors 107 and 108 are non-volatile, memory cell 100 is a non-volatile memory cell that maintains its stored logic values even when memory cell 100 is not receiving a source of power.

When memory cell 100 is powered up, supply voltage VDD increases from zero to its nominal operating value, and the difference in the resistances between resistors 107 and 108 causes the output voltages of inverters 101/102 and 104/105 at output terminals OUT1 and OUT2, respectively, to be in different logic states. If resistor 107 is programmed to a low resistance value, and resistor 108 is programmed to a high resistance value, then the output voltage of inverter 101/102 at OUT1 is in a logic low state after VDD powers up, and the output voltage of inverter 104/105 at OUT2 is in a logic high state after VDD powers up. If resistor 107 is programmed to a high resistance value, and resistor 108 is programmed to a low resistance value, then the output voltage of inverter 101/102 at OUT1 is in a logic high state after VDD powers up, and the output voltage of inverter 104/105 at OUT2 is in a logic low state after VDD powers up.

The inverters in memory cell 100 power up to logic states that reflect the difference in the programmed resistances of resistors 107 and 108. Only a moderate difference in resistance is required between resistors 107 and 108 to cause inverters 101/102 and 104/105 to enter stable logic states. For example, a low resistance value of 100 ohms for resistor 107 and a high resistance value of 1000 ohms for resistor 108 are sufficient to cause the inverters to maintain stable and opposite logic states at their output terminals. Resistances of 100 and 1000 ohms are well within the programmable range of non-volatile resistor cells.

The program/read signal lines can also be used for a read back function to verify the programmed resistance values of resistors 107 and 108. During a read back function, the program/read signal lines are charged to voltages that turn on transistors 103 and 106. The programmed resistance values of resistors 107 and 108 are verified by sensing voltages on the two data signal lines Data 1 and Data 2, respectively.

The output voltage at the output terminal OUT1 of inverter 101/102 and the output voltage at the output terminal OUT2 of inverter 104/105 represent the logic value stored in memory cell 100. The logic value stored in memory cell 100 is accessed by sensing the output voltage of at least one of the inverters at output terminals OUT 1 and OUT2. When memory cell 100 is in a stable state, the output terminal of one of the inverters is at the ground voltage, and the output terminal of the other inverter is at the VDD supply voltage. As a result, memory cell 100 provides output logic signals that span the full supply voltage range from VDD to ground, because the logic value stored in memory cell 100 is sensed from the output terminals OUT1 and OUT2 of the inverters, and the inverters receive supply voltage VDD. The output voltages of the inverters can, for example, be driven from the output terminals of inverters 101/102 and 104/105 to programmable routing or logic blocks in an FPGA. Memory cell 100 can be used to implement configuration RAM (CRAM) in an FPGA.

The resistances of resistors 107 and 108 can be re-programmed to opposite resistance values to change the logic value stored by memory cell 100. Resistors 107 and 108 are re-programmed by charging the program/read signal lines (Program/Read 1 and 2) to turn on access transistors 103 and 106 and then applying the appropriate programming voltages to the data signal lines (Data 1 and 2). For example, if resistor 107 was previously programmed to a high resistance, resistor 107 can be re-programmed to a low resistance by applying the appropriate voltage and current waveform through the first data signal line Data 1. If resistor 108 was previously programmed to a low resistance, resistor 108 can be re-programmed to a high resistance by applying the appropriate voltage and current waveform to resistor 108 through the second data signal line Data 2. After resistors 107 and 108 are re-programmed, resistors 107 and 108 maintain their re-programmed resistance values even when power is not applied to memory cell 100. This reprogramming can be performed either with VDD at its nominal power-on value, or set to a lower value including the ground voltage.

After resistors 107 and 108 have been re-programmed, the logic value stored in memory cell 100 can be changed by power cycling memory cell 100. First, supply voltage VDD is reduced to zero, if VDD is not already at zero. Then, supply voltage VDD is charged back to its nominal operating value. When supply voltage VDD is at its nominal operating value again, the output voltage of each inverter (101/102 and 104/105) is in a different logic state relative to its logic state before resistors 107 and 108 were re-programmed to opposite resistance values.

Once memory cell 100 is powered up, memory cell 100 does not have any more current leakage than a conventional 6-transistor static random access memory (SRAM) cell. Therefore, memory cell 100 acts as a non-volatile random access memory (RAM) cell that does not consume more power than a conventional SRAM cell. In addition, memory cell 100 only requires a small amount of additional die area compared to a conventional SRAM cell.

Because only a relatively small dynamic range of resistance is required for resistors 107 and 108, the yield of an integrated circuit containing numerous memory cells 100 is relatively high. Memory cell 100 has some asymmetry when resistors 107 and 108 are programmed, which may cause a small increase in the soft event upset (SEU) resistance, because the cell tends to prefer the state programmed into the resistors.

Figure 2:
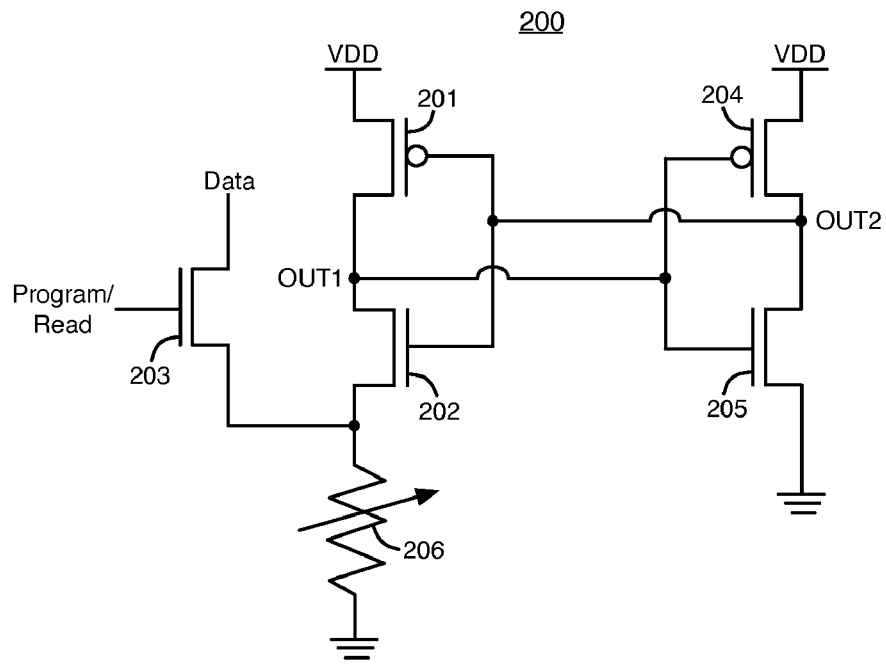
FIG. 2 is a diagram of a non-volatile memory cell having a single access transistor for programming a single programmable non-volatile resistor, according to another embodiment of the present invention.

FIG. 2 is a diagram of a non-volatile memory cell, according to another embodiment of the present invention. Non-volatile memory cell 200 shown in FIG. 2 includes 5 MOSFETs 201-205 and one programmable non-volatile resistor 206. MOSFETs 201 and 204 are p-channel transistors. MOSFETs 202, 203, and 205 are n-channel transistors.

Memory cell 200 has one less transistor and one less non-volatile resistor than memory cell 100. Also, memory cell 200 is coupled to only one data signal line and one program/read signal line. Therefore, memory cell 200 requires less silicon area on the die than memory cell 100. The data signal line is coupled to the drain of transistor 203, and the program/read signal line is coupled to the gate of transistor 203.

The dimensions of the transistors in memory cell 200 are adjusted, compared to the transistors in memory cell 100. Specifically, the dimensions of transistors 201 and 202 relative to the dimensions of transistors 204 and 205 are adjusted to account for the asymmetry of memory cell 200. Transistors 201 and 202 form a first inverter, and transistors 204 and 205 form a second inverter. The inverter formed by transistor 201 and 202 in conjunction with resistor 206 should provide two configurations that have substantially higher and lower logic switching thresholds compared to the inverter formed by transistors 204 and 205.

The two inverters in memory cell 200 are cross-coupled, as with the previous embodiment. Programmable non-volatile resistor 206 is coupled between the source of transistor 202 and ground. The source of transistor 203 is coupled to resistor 206 and to the source of transistor 202. The sources of p-channel transistors 201 and 204 receive power supply voltage VDD.

Resistor 206 can be accessed through the data signal line by raising the voltage on the program/read signal line to a voltage that turns transistor 203 on. When transistor 203 is on, the data signal line is driven with the appropriate voltage and current waveform to program programmable non-volatile resistor 206 to the desired resistance.

Resistor 206 is a non-volatile resistor. Resistor 206 maintains its programmed resistance value when zero volts is applied across resistor 206. After memory cell 200 is powered down and then powered up again, inverters 201/202 and 204/205 store voltages at their output terminals that are based on the programmed resistance of resistor 206. The output voltage of one of the inverters is at supply voltage VDD, and the output voltage of the other inverter is at the ground voltage.

For example, an appropriate voltage and current waveform can be applied to the data signal line to program resistor 206 to a high resistance value. After memory cell 200 is powered down and then powered up again, the output voltage of inverter 201/202 at output terminal OUT1 is in a logic high state, and the output voltage of inverter 204/205 at output terminal OUT2 is in a logic low state.

The output voltages of inverters 201/202 and 204/205 represents a logic value stored in memory cell 200. The output voltage of inverter 201/202 can be accessed from output terminal OUT1, and the output voltage of inverter 204/205 can be accessed from output terminal OUT2. The logic value stored in memory cell 200 can be accessed by sensing the output voltage of one or both of the inverters at output terminals OUT1 and OUT2.

Figure 3A:
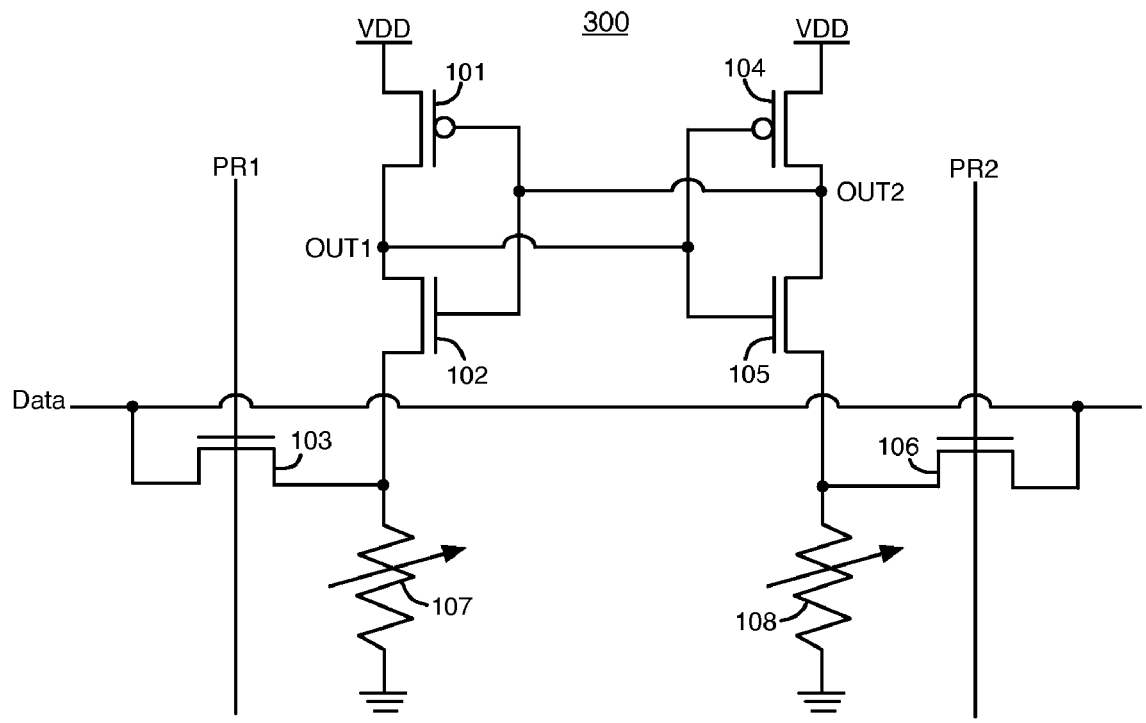
FIG. 3A is a diagram of a non-volatile memory cell coupled to two program/read signal lines and one data signal line, according to yet another embodiment of the present invention.

FIG. 3A is a diagram of a non-volatile memory cell, according to yet another embodiment of the present invention. Memory cell 300 in FIG. 3A includes the same transistors and programmable non-volatile resistors as memory cell 100 in FIG. 1. However, memory cell 300 is coupled to a single data signal line (Data). The data signal line Data is coupled to the drains of access transistors 103 and 106. Memory cell 300 is coupled to two program/read signal lines. The first program/read signal line (PR1) is coupled to the gate of access transistor 103, and the second program/read signal line (PR2) is coupled to the gate of access transistor 106.

In memory cell 300, programmable non-volatile resistors 107 and 108 are not programmed at the same time. Instead, programmable non-volatile resistors 107 and 108 are programmed at different times. The resistor being programmed is coupled to the data signal line through an access transistor, and the resistor that is not being programmed is decoupled from the data signal.

For example, in order to program resistor 107, a voltage is applied to program/read signal line PR1 that turns on access transistor 103, and a voltage is applied to program/read signal line PR2 that turns off access transistor 106. While transistor 103 is on, an appropriate voltage and current waveform is applied to the data signal line Data to program resistor 107 to a desired resistance. In order to program resistor 108, a voltage is applied to program/read signal line PR1 that turns off access transistor 103, and a voltage is applied to program/read signal line PR2 that turns on access transistor 106. While transistor 106 is on, an appropriate voltage and current waveform is applied on the data signal line Data to program resistor 108 to a desired resistance.

The output voltages of inverters 101/102 and 104/105 at output terminals OUT1 and OUT2, respectively, represent the logic value stored in memory cell 300. The logic value stored in memory cell 300 can be accessed by sensing the output voltage of inverter 101/102 at output terminal OUT1 and/or the output voltage of inverter 104/105 at output terminal OUT2.

Figure 3B:
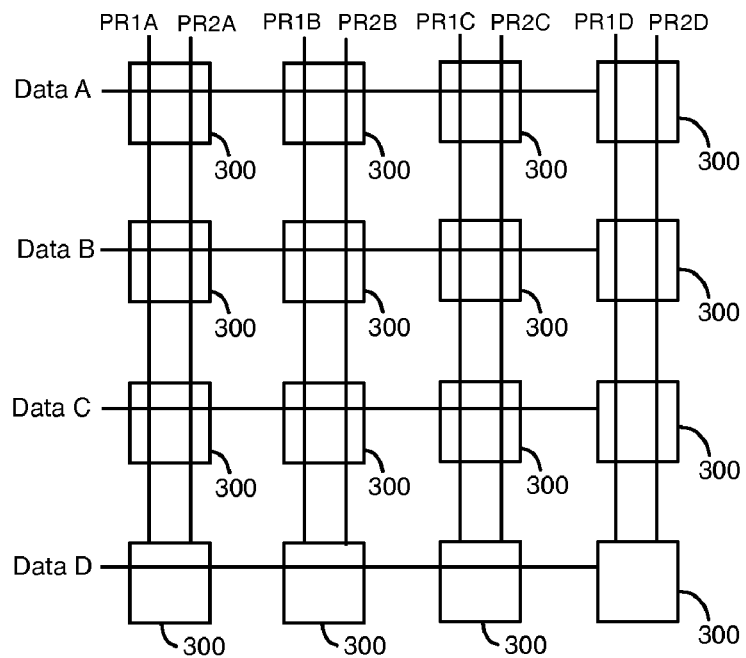
FIG. 3B illustrates an example of a memory array of memory cells that are arranged in rows and columns, according to an embodiment of the present invention.

Memory cells are typically arranged in a grid of rows and columns. Each row and column can have numerous memory cells having the same architecture. The grid structure allows several memory cells to be programmed at the same time. FIG. 3B illustrates an example of a memory array of memory cells 300 that are arranged in rows and columns, according to an embodiment of the present invention.

Each row of memory cells 300 in FIG. 3B is coupled to one data signal line. The first row of memory cells 300 is coupled to data signal line Data A. The second row of memory cells 300 is coupled to data signal line Data B. The third row of memory cells 300 is coupled to data signal line Data C. The fourth row of memory cells 300 is coupled to data signal line Data D.

Each column of memory cells 300 in FIG. 3B is coupled to two program/read signal lines. The first column of memory cells 300 is coupled to program/read signal lines PR1A and PR2A. The second column of memory cells 300 is coupled to program/read signal lines PR1B and PR2B. The third column of memory cells 300 is coupled to program/read signal lines PR1C and PR2C. The fourth column of memory cells 300 is coupled to program/read signal lines PR1D and PR2D.

Figure 4A:
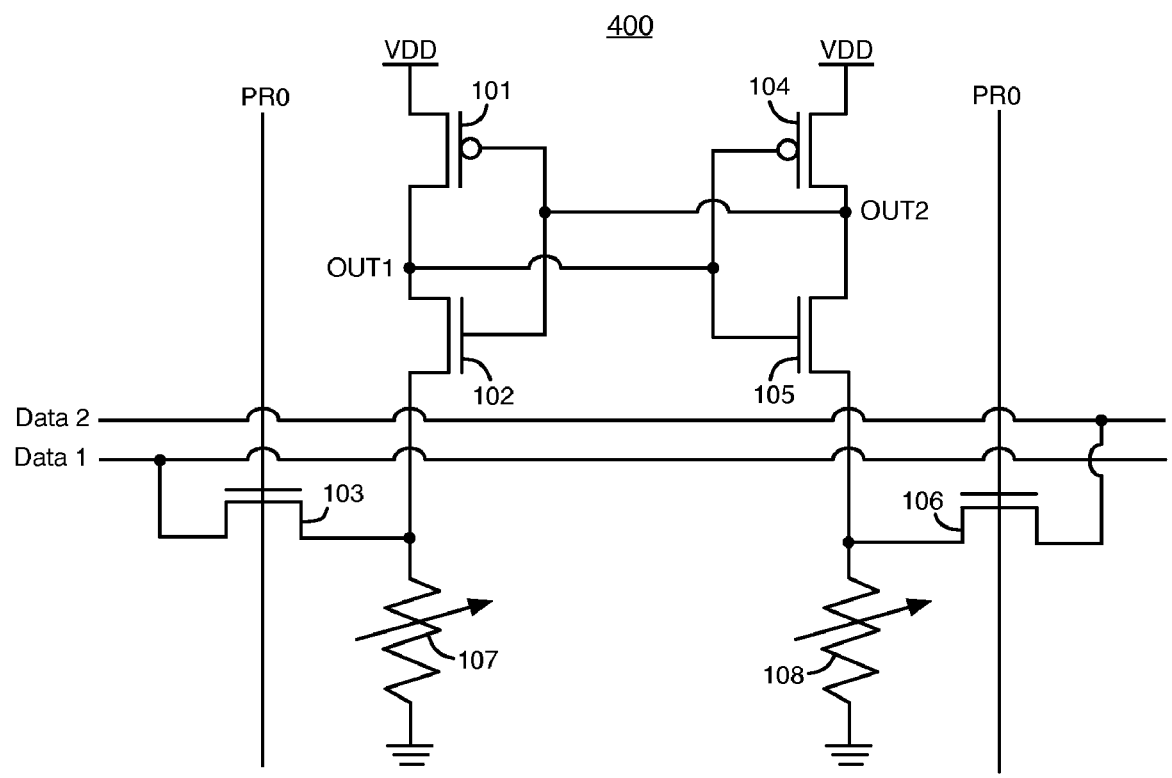
FIG. 4A is a diagram of a non-volatile memory cell coupled to one program/read signal line and two data signal lines, according to yet another embodiment of the present invention.

FIG. 4A is a diagram of a non-volatile memory cell, according to yet another embodiment of the present invention. Memory cell 400 in FIG. 4A includes the same transistors and programmable non-volatile resistors as memory cell 100 in FIG. 1. However, memory cell 400 is coupled to a single program/read signal line PR0. Program/read signal line (PR0) is coupled to the gate of access transistor 103 and to the gate of access transistor 106. Memory cell 400 is coupled to two data signal lines Data 1 and Data 2. Data signal line Data 1 is coupled to the drain of access transistor 103, and data signal line Data 2 is coupled to the drain of access transistor 106.

In memory cell 400, resistors 107 and 108 can be programmed at the same time. The voltage on the program/read signal line PR0 is charged to a voltage that turns on access transistors 103 and 106. While access transistors 103 and 106 are on, appropriate voltage and current waveforms are applied to the data signal lines Data 1 and 2 that program resistors 107 and 108, respectively.

The output voltages of inverters 101/102 and 104/105 at output terminals OUT1 and OUT2, respectively, represent the logic value stored in memory cell 400. A logic value stored in memory cell 400 can be accessed by sensing the output voltage of inverter 101/102 at output terminal OUT1 and/or the output voltage of inverter 104/105 at output terminal OUT2.

Figure 4B:
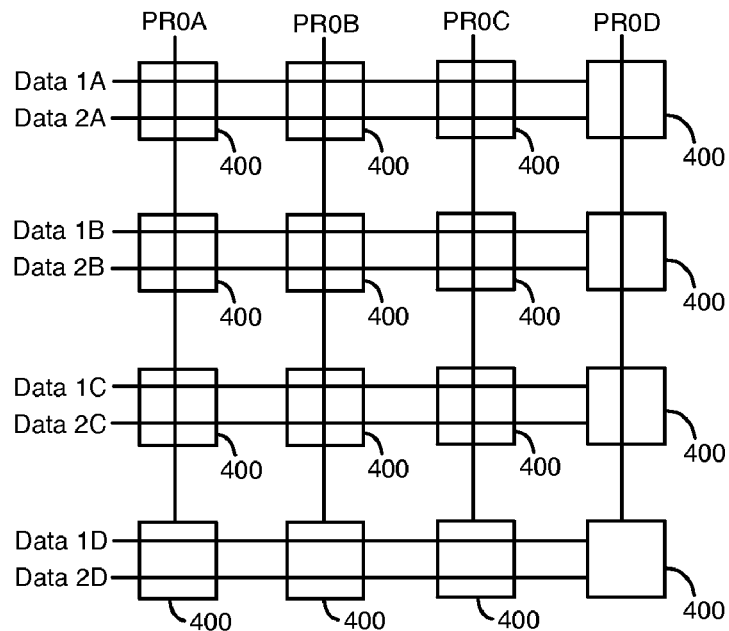
FIG. 4B illustrates an example of a memory array of memory cells that are arranged in rows and columns, according to another embodiment of the present invention.

FIG. 4B illustrates an example of a memory array of memory cells 400 that are arranged in rows and columns, according to an embodiment of the present invention. The first row of memory cells 400 is coupled to data signal lines Data 1A and 2A. The second row of memory cells 400 is coupled to data signal lines Data 1B and 2B. The third row of memory cells 400 is coupled to data signal lines Data 1C and 2C. The fourth row of memory cells 400 is coupled to data signal lines 1D and 2D.

In FIG. 4B, the first column of memory cells 400 is coupled to program/read signal line PR0A. The second column of memory cells 400 is coupled to program/read signal line PR0B. The third column of memory cells 400 is coupled to program/read signal line PR0C. The fourth column of memory cells 400 is coupled to program/read signal line PR0D.

According to additional embodiments of the present invention, non-volatile memory cells use diodes as access devices to program the programmable non-volatile resistors. FIGS. 5-8 illustrate examples of embodiments of the present invention that use diodes as access devices to program the programmable non-volatile resistors.

Figure 5:
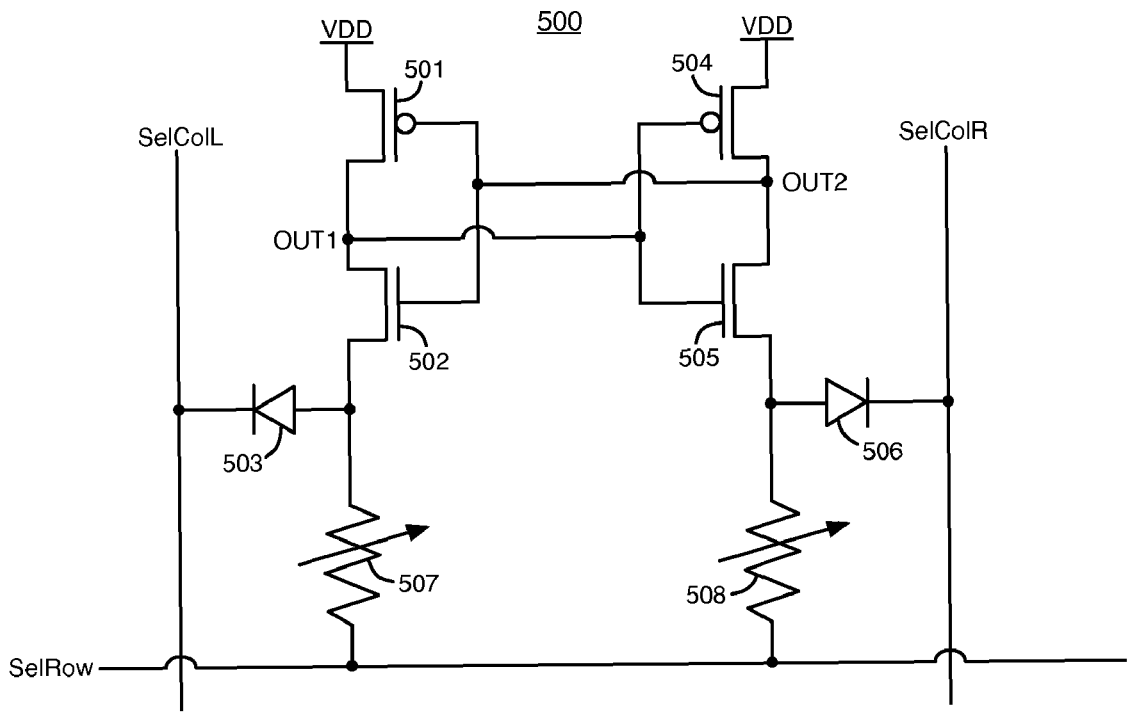
FIG. 5 is a diagram of a non-volatile memory cell having access diodes, according to another embodiment of the present invention.

FIG. 5 illustrates an example of a non-volatile memory cell having access diodes, according to another embodiment of the present invention. Non-volatile memory cell 500 in FIG. 5 includes p-channel MOSFETs 501 and 504, n-channel MOSFETs 502 and 505, diodes 503 and 506, and programmable non-volatile resistors 507 and 508. The inverter formed by transistors 501/502 is cross-coupled with the inverter formed by transistors 504/505.

The sources of p-channel transistors 501 and 504 receive supply voltage VDD. The source of n-channel transistor 502 is coupled to the anode of diode 503 and to the first terminal of resistor 507. The second terminal of resistor 507 is coupled to a row select signal line SelRow. The cathode of diode 503 is coupled to the left column select signal line SelColL. The source of n-channel transistor 505 is coupled to the anode of diode 506 and to the first terminal of resistor 508. The second terminal of resistor 508 is coupled to the row select signal line SelRow. The cathode of diode 506 is coupled to the right column select signal line SelColR.

To program resistors 507 and 508, programming voltage and current waveforms are applied across the appropriate row and column select signal lines. The row and column select signal lines are charged to drive current through a specific set of diodes that programs the associated resistors. The voltages applied across the row and column select signal lines are selected to forward bias (i.e., turn on) the selected diodes and to program the selected resistors to the desired resistances. In memory cell 500, the row select signal line is charged to a voltage that is greater than the voltage on the column select signal line in order to program the resistor coupled between the corresponding diode and the row signal select line.

Resistor 507 can be programmed to a desired resistance value by applying the appropriate voltage and current waveform to resistor 507 through row select signal line SelRow and left column select signal line SelColL. Resistor 508 can be programmed to a desired resistance value by applying the appropriate voltage and current waveform to resistor 508 through row select signal line SelRow and right column select signal line SelColR.

The voltage and current waveform is selected to forward bias the diode (503 or 506) and to program the programmable resistor (507 or 508) to the desired resistance value. Because diodes 503 and 506 only conduct current in one direction, the voltage and current waveform applied to the programmable resistor can only provide current flow in a single direction. Therefore, the programming method of FIG. 5 is only appropriate for programmable resistors that can be programmed by varying the magnitude and shape of the voltage and current waveform, but that do not rely on current flow in both directions to set the resistor in either of the two resistance states.

Resistors 507 and 508 are non-volatile resistors. Resistors 507 and 508 maintain their programmed resistance values when the voltage drops across the resistors are zero. After the supply voltage VDD provided to memory cell 500 is powered down and then powered up again, inverters 501/502 and 504/505 store voltages at their output terminals that reflect the programmed resistances of resistors 507 and 508, as described above with respect to memory cell 100. The output voltage of one of the inverters is at supply voltage VDD, and the output voltage of the other inverter is at the ground voltage. During normal operation when the resistors are not being programmed, the row select signal line is held at ground to provide normal operation of the cross-coupled inverters, and the column select signal lines are held at a voltage of ground or higher to reverse bias diodes 503 and 506.

The output voltages of inverters 501/502 and 504/505 at output terminals OUT1 and OUT2, respectively, represent the logic value stored in memory cell 500. The logic value stored in memory cell 500 can be accessed by sensing the output voltage of one or both of the inverters at output terminals OUT1 and OUT2.

Figure 6:
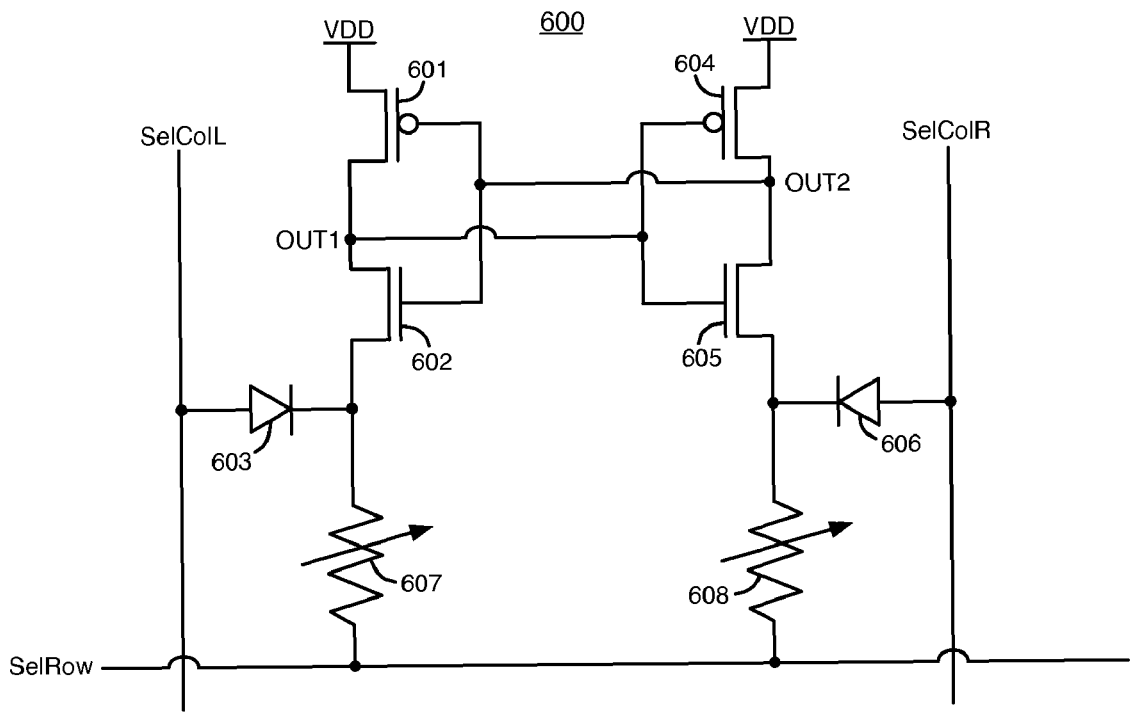
FIG. 6 is a diagram of another non-volatile memory cell having access diodes, according to another embodiment of the present invention.

FIG. 6 illustrates another example of a non-volatile memory cell having access diodes, according to another embodiment of the present invention. Non-volatile memory cell 600 in FIG. 6 includes p-channel MOSFETs 601 and 604, n-channel MOSFETs 602 and 605, diodes 603 and 606, and programmable non-volatile resistors 607 and 608.

The inverter formed by transistors 601/602 is cross-coupled with the inverter formed by transistors 604/605.

The sources of p-channel transistors 601 and 604 receive supply voltage VDD. The source of n-channel transistor 602 is coupled to the cathode of diode 603 and to the first terminal of resistor 607. The second terminal of resistor 607 is coupled to row select signal line SelRow. The anode of diode 603 is coupled to left column select signal line SelColL. The source of n-channel transistor 605 is coupled to the cathode of diode 606 and to the first terminal of resistor 608. The second terminal of resistor 608 is coupled to row select signal line SelRow. The anode of diode 606 is coupled to right column select signal line SelColR.

To program resistors 607 and 608, programming voltage and current waveforms are applied across the appropriate column and row select signal lines. The column and row select signal lines are charged to drive current through a specific set of diodes that programs the associated resistors. The voltages applied across the column and row select signal lines are selected to forward bias (i.e., turn on) the selected diodes and to program the selected resistors to the desired resistances. In memory cell 600, the column select signal line is charged to a voltage that is greater than the voltage on the row select signal line to program the resistor coupled between the corresponding diode and the row select signal line.

For example, resistor 607 can be programmed to a desired resistance value by applying the appropriate voltage and current waveform to left column select signal line SelColL and row select signal line SelRow. The voltage and current waveform applied across the SelColL and SelRow signal lines is selected to forward bias diode 603 and to program resistor 607 to the desired resistance value.

Resistor 608 can be programmed to a desired resistance value by applying the appropriate voltage and current waveform between right column select signal line SelColR and row select signal line SelRow. The voltage and current waveform applied across the SelColR and SelRow signal lines is selected to forward bias diode 606 and to program resistor 608 to the desired resistance value.

Resistors 607 and 608 are non-volatile resistors. Resistors 607 and 608 maintain their programmed resistance values when the voltage drops across the resistors are zero. After the supply voltage VDD provided to memory cell 600 is powered down and then powered up again, inverters 601/602 and 604/605 store voltages at their output terminals OUT1 and OUT2, respectively, that reflect the programmed resistances of resistors 607 and 608, as described above with respect to memory cell 100. The output voltage of one of the inverters is at supply voltage VDD, and the output voltage of the other inverter is at the ground voltage. During normal operation, the row and column select signal lines are held at voltages that reverse bias diodes 603 and 606.

The output voltages of inverters 601/602 and 604/605 at output terminals OUT1 and OUT2, respectively, represent the logic value stored in memory cell 600. The logic value stored in memory cell 600 can be accessed by sensing the output voltage of one or both of the inverters at output terminals OUT1 and OUT2.

Figure 7:
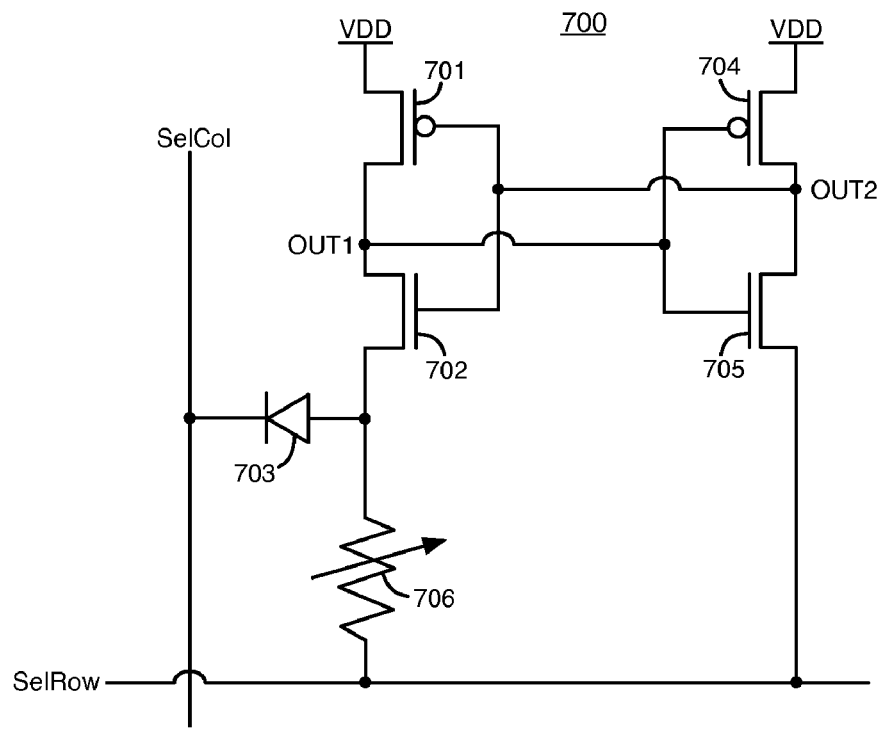
FIG. 7 is a diagram of a non-volatile memory cell having a single access diode for programming a single programmable non-volatile resistor, according to yet another embodiment of the present invention.

FIG. 7 illustrates an example of a non-volatile memory cell having a single access diode for programming a single programmable non-volatile resistor, according to yet another embodiment of the present invention. Non-volatile memory cell 700 includes p-channel MOSFETs 701 and 704, n-channel MOSFETs 702 and 705, diode 703, and only one programmable non-volatile resistor 706. The inverter formed by transistors 701/702 is cross-coupled with the inverter formed by transistors 704/705.

The sources of p-channel transistors 701 and 704 receive supply voltage VDD. The source of n-channel transistor 702 is coupled to the anode of diode 703 and to the first terminal of resistor 706. The second terminal of resistor 706 is coupled to row select signal line SelRow. The cathode of diode 703 is coupled to column select signal line SelCol. The source of n-channel transistor 705 is coupled to row select signal line SelRow.

To program resistor 706, a programming voltage and current waveform is applied across the row select signal line SelRow and the column select signal line SelCol. The row and column select signal lines SelRow and SelCol are charged to drive a current through diode 703 that programs resistor 706. The voltage applied across the row and column select signal lines is selected to forward bias (i.e., turn on) diode 703 and to program resistor 706 to the desired resistance. Resistor 706 can be programmed to a specific resistance value by applying the appropriate voltage and current waveform between row select signal line SelRow and column select signal line SelCol. In memory cell 700, the row select signal line SelRow is charged to a voltage that is greater than the voltage on the column select signal line SelCol to program resistor 706.

Resistor 706 is a non-volatile resistor that maintains its programmed resistance when the voltage drop across resistor 706 is zero. After the supply voltage VDD provided to memory cell 700 is powered down and then powered up again, inverters 701/702 and 704/705 store voltages at their output terminals OUT1 and OUT2, respectively, that reflect the programmed resistance of resistor 706, as described above with respect to memory cell 200. The output voltage of one of the inverters is at supply voltage VDD, and the output voltage of the other inverter is at the ground voltage. During normal operation, the row and column select signal lines are held at voltages that reverse bias diode 703.

The output voltages of inverters 701/702 and 704/705 at output terminals OUT1 and OUT2, respectively, represent the logic value stored in memory cell 700. The logic value stored in memory cell 700 can be accessed by sensing the output voltage of one or both of the inverters at output terminals OUT1 and OUT2.

Figure 8:
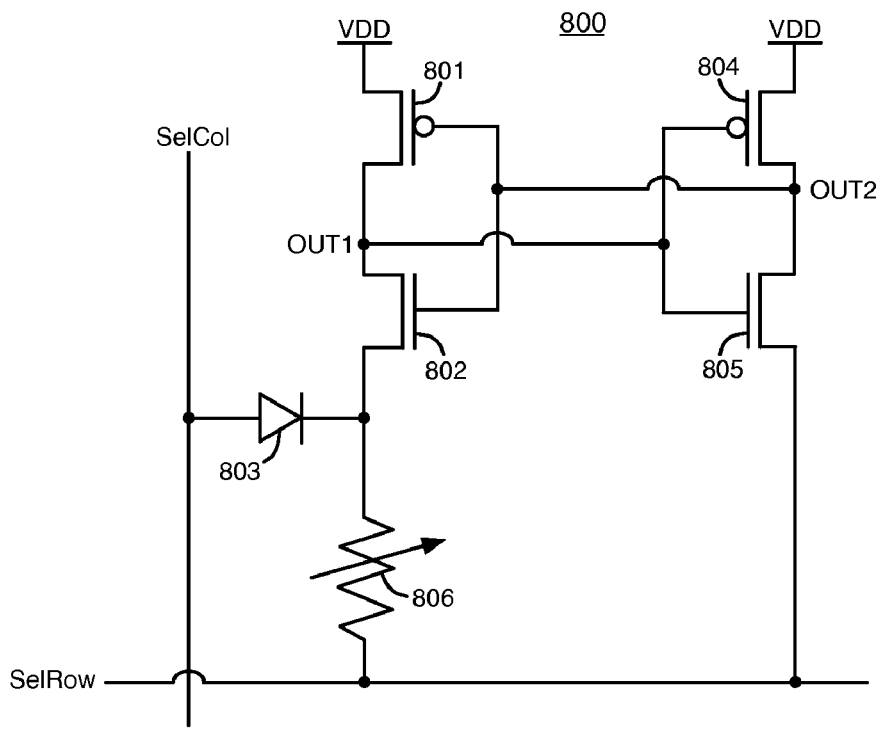
FIG. 8 is a diagram of another non-volatile memory cell having a single access diode for programming a single programmable non-volatile resistor, according to yet another embodiment of the present invention.

FIG. 8 illustrates another example of a non-volatile memory cell having a single access diode for programming a single programmable non-volatile resistor, according to yet another embodiment of the present invention. Non-volatile memory cell 800 includes p-channel MOSFETs 801 and 804, n-channel MOSFETs 802 and 805, diode 803, and only one programmable non-volatile resistor 806. The inverter formed by transistors 801/802 is cross-coupled with the inverter formed by transistors 804/805.

The sources of p-channel transistors 801 and 804 receive supply voltage VDD. The source of n-channel transistor 802 is coupled to the cathode of diode 803 and to the first terminal of resistor 806. The second terminal of resistor 806 is coupled to row select signal line SelRow. The anode of diode 803 is coupled to column select signal line SelCol. The source of n-channel transistor 805 is coupled to row select signal line SelRow.

To program resistor 806, a programming voltage and current waveform is applied across the column select signal line SelCol and the row select signal line SelRow. The column and row select signal lines SelCol and SelRow are charged to drive a current through diode 803 that programs resistor 806. The voltage applied across the column and row select signal lines is selected to forward bias (i.e., turn on) diode 803 and to program resistor 806 to the desired resistance. Resistor 806 can be programmed to a desired resistance value by applying the appropriate voltage and current waveform between column select signal line SelCol and row select signal line SelRow. In memory cell 800, the column select signal line SelCol is charged to a voltage that is greater than the voltage on the row select signal line SelRow to program resistor 806.

Resistor 806 is a non-volatile resistor that maintains its programmed resistance when the voltage drop across resistor 806 is zero. After the supply voltage VDD provided to memory cell 800 is powered down and then powered up again, inverters 801/802 and 804/805 store voltages at their output terminals OUT1 and OUT2, respectively, that reflect the programmed resistance of resistor 806, as described above with respect to memory cell 200. The output voltage of one of the inverters is at VDD, and the output voltage of the other inverter is at the ground voltage. During normal operation, the column and row select signal lines are held at voltages that reverse bias diode 803.

The output voltages of inverters 801/802 and 804/805 at output terminals OUT1 and OUT2, respectively, represent the logic value stored in memory cell 800. The logic value stored in memory cell 800 can be accessed by sensing the output voltage of one or both of the inverters at output terminals OUT1 and OUT2.

Figure 9:
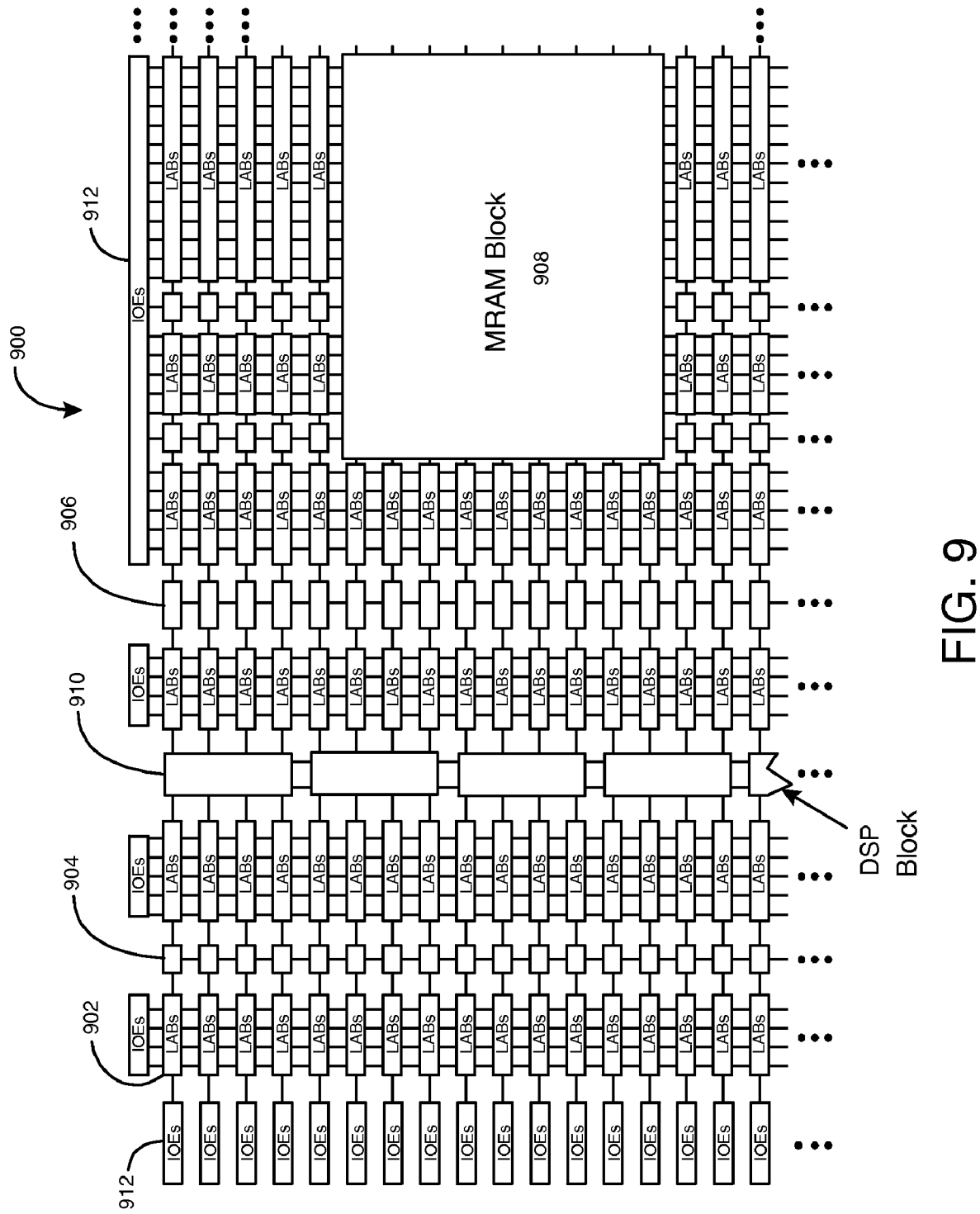
FIG. 9 is a simplified partial block diagram of a field programmable gate array (FPGA) that can include aspects of the present invention.

FIG. 9 is a simplified partial block diagram of a field programmable gate array (FPGA) 900 that can include aspects of the present invention. FPGA 900 is merely one example of an integrated circuit that can include features of the present invention. It should be understood that embodiments of the present invention can be used in numerous types of integrated circuits such as field programmable gate arrays (FPGAs), programmable logic devices (PLDs), complex programmable logic devices (CPLDs), programmable logic arrays (PLAs), and application specific integrated circuits (ASICs).

FPGA 900 includes a two-dimensional array of programmable logic array blocks (or LABs) 902 that are interconnected by a network of column and row interconnect conductors of varying length and speed. LABs 902 include multiple (e.g., 10) logic elements (or LEs).

An LE is a programmable logic circuit block that provides for efficient implementation of user defined logic functions. An FPGA has numerous logic elements that can be configured to implement various combinatorial and sequential functions. The logic elements have access to a programmable interconnect structure. The programmable interconnect structure can be programmed to interconnect the logic elements in almost any desired configuration.

FPGA 900 also includes a distributed memory structure including random access memory (RAM) blocks of varying sizes provided throughout the array. The RAM blocks include, for example, blocks 904, blocks 906, and block 908. Memory blocks 904, 906, and 908 can include memory cells of the present invention, such as memory cells 100, 200, 300, 400, 500, 600, 700, and/or 800. These memory blocks can also include shift registers and FIFO buffers.

FPGA 900 further includes digital signal processing (DSP) blocks 910 that can implement, for example, multipliers with add or subtract features. Input/output elements (IOEs) 912 located, in this example, around the periphery of the chip, support numerous single-ended and differential input/output standards. IOEs 912 are coupled to input/output pins. Each of the input/output pins is an external terminal of the FPGA. It is to be understood that FPGA 900 is described herein for illustrative purposes only and that the present invention can be implemented in many different types of PLDs, FPGAs, and ASICs.

Figure 10:
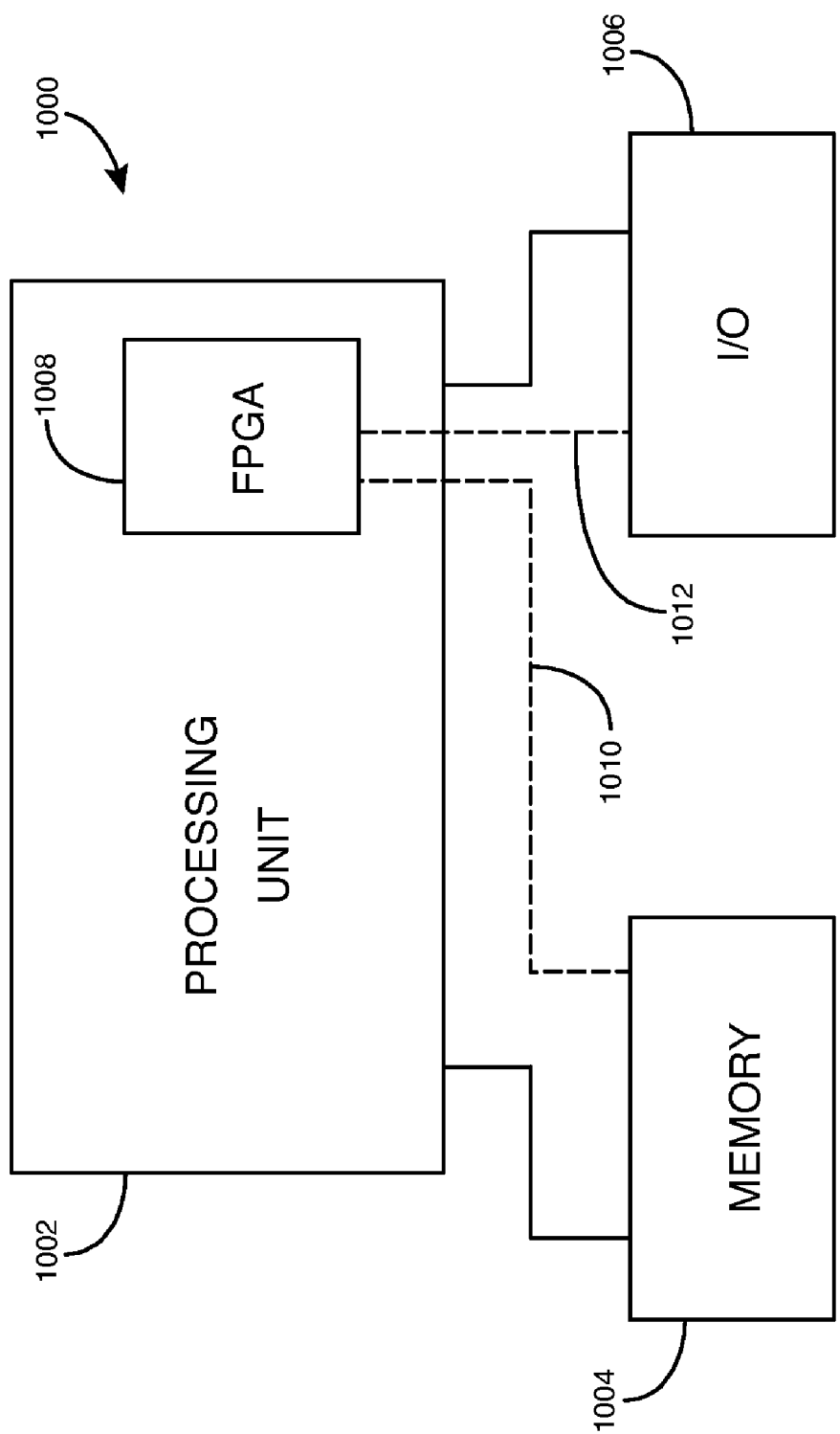
FIG. 10 shows a block diagram of an exemplary digital system that can embody techniques of the present invention.

The present invention can also be implemented in a system that has an FPGA as one of several components. FIG. 10 shows a block diagram of an exemplary digital system 1000 that can embody techniques of the present invention. System 1000 can be a programmed digital computer system, digital signal processing system, specialized digital switching network, or other processing system. Moreover, such systems can be designed for a wide variety of applications such as telecommunications systems, automotive systems, control systems, consumer electronics, personal computers, Internet communications and networking, and others. Further, system 1000 can be provided on a single board, on multiple boards, or within multiple enclosures.

System 1000 includes a processing unit 1002, a memory unit 1004, and an input/output (I/O) unit 1006 interconnected together by one or more buses. According to this exemplary embodiment, an FPGA 1008 is embedded in processing unit 1002. FPGA 1008 can serve many different purposes within the system of FIG. 10. FPGA 1008 can, for example, be a logical building block of processing unit 1002, supporting its internal and external operations. FPGA 1008 is programmed to implement the logical functions necessary to carry on its particular role in system operation. FPGA 1008 can be specially coupled to memory 1004 through connection 1010 and to I/O unit 1006 through connection 1012.

Processing unit 1002 can direct data to an appropriate system component for processing or storage, execute a program stored in memory 1004, receive and transmit data via I/O unit 1006, or other similar functions. Processing unit 1002 can be a central processing unit (CPU), microprocessor, floating point coprocessor, graphics coprocessor, hardware controller, microcontroller, field programmable gate array programmed for use as a controller, network controller, or any type of processor or controller. Furthermore, in many embodiments, there is often no need for a CPU.

For example, instead of a CPU, one or more FPGAs 1008 can control the logical operations of the system. As another example, FPGA 1008 acts as a reconfigurable processor, which can be reprogrammed as needed to handle a particular computing task. Alternatively, FPGA 1008 can itself include an embedded microprocessor. Memory unit 1004 can be a random access memory (RAM), read only memory (ROM), fixed or flexible disk media, flash memory, tape, or any other storage means, or any combination of these storage means.

The foregoing description of the exemplary embodiments of the present invention has been presented for the purposes of illustration and description. The foregoing description is not intended to be exhaustive or to limit the present invention to the examples disclosed herein. In some instances, features of the present invention can be employed without a corresponding use of other features as set forth. Many modifications, substitutions, and variations are possible in light of the above teachings, without departing from the scope of the present invention.

What is claimed is:

1. A non-volatile memory circuit comprising:
a first inverter comprising first and second transistors;
a second inverter coupled to the first inverter, wherein the second inverter comprises third and fourth transistors;
a first programmable non-volatile resistor that is directly connected to a source of the second transistor; and
a first access device coupled to the first programmable non-volatile resistor.

2. The non-volatile memory circuit defined in claim 1 wherein the first programmable non-volatile resistor is connected directly to a node at a ground voltage.

3. The non-volatile memory circuit defined in claim 1 further comprising:
a second programmable non-volatile resistor coupled to the second inverter; and
a second access device coupled to the second programmable non-volatile resistor.

4. The non-volatile memory circuit defined in claim 3 wherein the first access device comprises a first fifth transistor and the second access device comprises a sixth transistor.

5. The non-volatile memory circuit defined in claim 4 wherein a gate of the fifth transistor and a gate of the sixth transistor are coupled to a program/read signal line, a drain of the fifth transistor is coupled to a first data signal line, and a drain of the sixth transistor is coupled to a second data signal line.

6. The non-volatile memory circuit defined in claim 4 wherein a drain of the fifth transistor and a drain of the sixth transistor are coupled to a data signal line, a gate of the fifth transistor is coupled to a first program/read signal line, and a gate of the sixth transistor is coupled to a second program/read signal line.

7. The non-volatile memory circuit defined in claim 3 wherein the first and the second programmable non-volatile resistors are electrolytic programmable non-volatile resistors.

8. The non-volatile memory circuit defined in claim 3 wherein the first and the second programmable non-volatile resistors comprise chalcogenide glass.

9. The non-volatile memory circuit defined in claim 3 wherein the second programmable non-volatile resistor is directly connected to a source of the fourth transistor.

10. A programmable logic integrated circuit that has a plurality of memory cells, wherein each of the memory cells comprises the non-volatile memory circuit defined in claim 1.

11. An integrated circuit comprising a memory array having non-volatile memory circuits, wherein each of the non-volatile memory circuits comprises:
a first inverter comprising first and second transistors;
a second inverter comprising third and fourth transistors, wherein the second inverter is cross-coupled with the first inverter;
a first programmable non-volatile resistor having a first terminal that is directly connected to a source of the second transistor; and
a first access device coupled to the second transistor and the first programmable non-volatile resistor.

12. The integrated circuit defined in claim 11 further comprising:
a second programmable non-volatile resistor that is directly connected to a source of the fourth transistor; and
a second access device coupled to the fourth transistor and the second programmable non-volatile resistor.

13. The integrated circuit defined in claim 12 wherein the first access device is a fifth transistor and the second access device is a sixth transistor.

14. The integrated circuit defined in claim 11 wherein the first access device is a fifth transistor.

15. The integrated circuit defined in claim 11 wherein the integrated circuit is a field programmable gate array.

16. The integrated circuit defined in claim 11 wherein a second terminal of the first programmable non-volatile resistor is directly connected to a node at a ground voltage.

17. The non-volatile memory circuit defined in claim 1 wherein the first access device comprises a diode.

18. The non-volatile memory circuit defined in claim 3 wherein the first access device comprises a first diode and the second access device comprises a second diode.

19. The integrated circuit defined in claim 12 wherein the first access device is a first diode and the second access device is a second diode.

20. The integrated circuit defined in claim 11 wherein the first access device is a diode.

* * * * *